United States Patent [19]

Smith et al.

[11] Patent Number: 4,613,941
[45] Date of Patent: Sep. 23, 1986

[54] ROUTING METHOD IN COMPUTER AIDED CUSTOMIZATION OF A TWO LEVEL AUTOMATED UNIVERSAL ARRAY

[75] Inventors: David C. Smith, Williamstown; Richard Noto, Maple Shade, both of N.J.

[73] Assignee: The United States of America as represented by the Secretary of the Army, Washington, D.C.

[21] Appl. No.: 751,339

[22] Filed: Jul. 2, 1985

[51] Int. Cl.$^4$ .................................... G06F 15/20
[52] U.S. Cl. .................................... 364/490
[58] Field of Search ............... 364/488, 489, 490, 491

[56] References Cited

U.S. PATENT DOCUMENTS 4,500,963  2/1985  Smith et al. .................... 364/300

Primary Examiner—Michael L. Gellner
Attorney, Agent, or Firm—Anthony T. Lane; Jeremiah G. Murray; Robert A. Maikis

[57] ABSTRACT

A routing method implemented in the stored programs of a digital computer which is programmably operated to generate the wire interconnect masks for a two level metallization automated universal array having undefined roadbeds between rows of cells comprised of identical semiconductor device basic units which are further interconnected to provide a particular integrated circuit structure. Conductor routing is provided by a computer aided design system that, among other things, carries out a route analysis process which determines in which roadbed each wire should be tentatively routed in conjunction with generating a routing density profile for minimizing congestion for a particular circuit design and when the roadbed density is exceeded, certain wires are removed under a set of criteria for routing by a pathfinder routing process. Following route analysis, detailed routing and rerouting is performed sequentially by a direct routing process, a greedy channel routing process, and a pathfinder routing process with rerouting being performed after each channel router and pathfinding process. Furthermore, the greedy channel routing process makes a single pass from left to right in all wires which cross successive points simultaneously and, if necessary, deleting a wire or wires which are then rerouted by the pathfinding process.

13 Claims, 25 Drawing Figures

BASIC UNIT

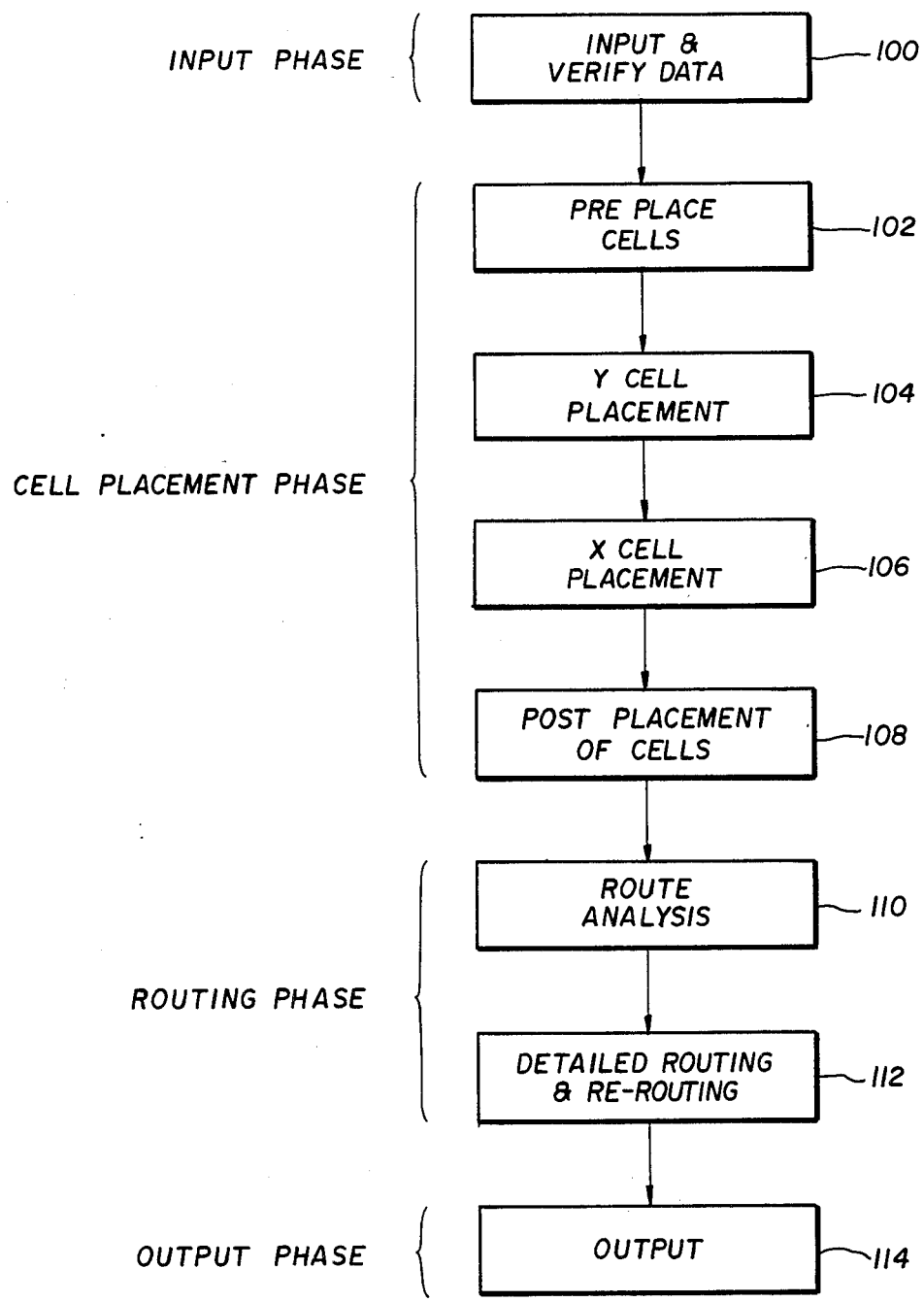

ROUTE ANALYSIS, 110

DETAILED ROUTING & RE-ROUTING, 112

FIG.12A
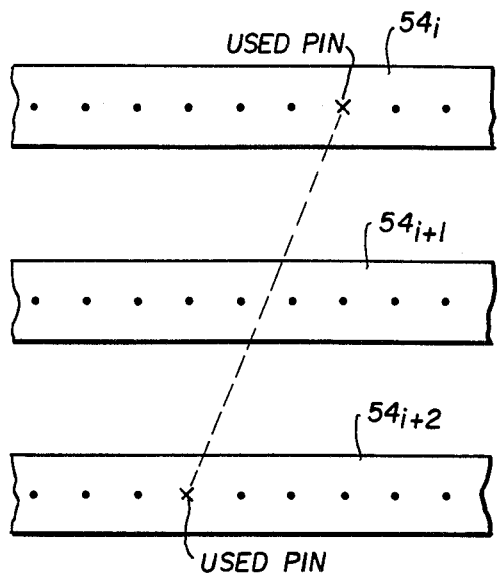
FIG.12B
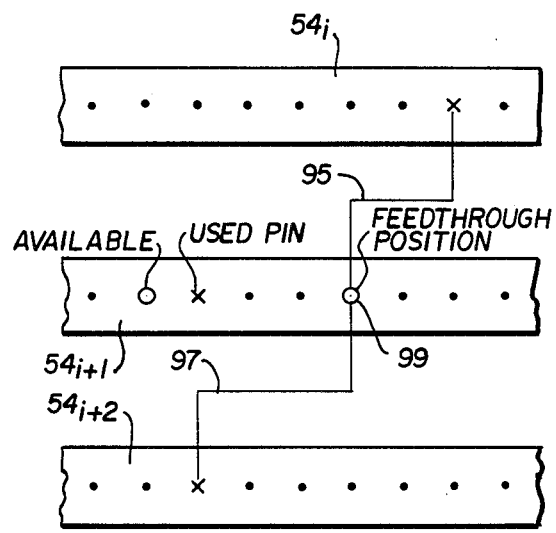
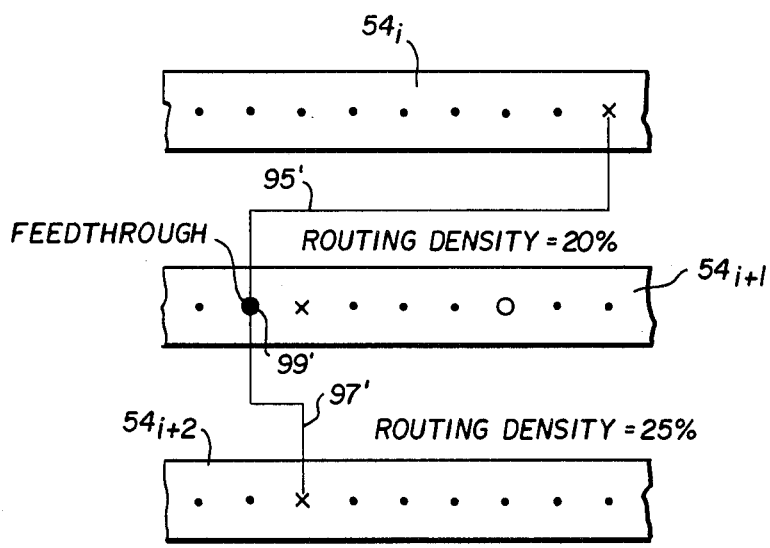
FIG.12C

ROUTING METHOD IN COMPUTER AIDED CUSTOMIZATION OF A TWO LEVEL AUTOMATED UNIVERSAL ARRAY

STATEMENT OF GOVERNMENT RIGHTS

The Government has rights in this invention pursuant to Contract No. DAAK20-82-C-0397 ordered by the Department of the Army.

BACKGROUND OF THE INVENTION

1. Field of the Invention

This invention relates to the method of implementing an automatic routing layout for automated universal arrays and more particularly to a computer program which effectively routes conductors on both levels of a double level metal automated universal array.

2. Description of the Prior Art

Large scale integrated semiconductor arrays comprising a layout of predefined uncommitted semiconductor devices are generally well known and comprise an orderly uniform arrangement of standard basic units of semiconductor devices selectively interconnected to form a combination of "logic cells" or gates which are further interconnected to provide a customized integrated circuit. A universal array particularly adapted for automatic layout techniques is shown and disclosed, for example, in applicant's copending application entitled, "Automated Universal Array", U.S. Ser. No. 305,825, which was filed in the name of F. Borgini, et al. on Sept. 28, 1981. There the array comprises an interior row region of many parallel rows of identical basic units. Each basic unit, moreover, contains four semiconductor devices with one or more basic units being further utilized upon being connected for implementing a logic cell such as an AND gate, OR gate, flip-flop, etc. This interior region is surrounded by a rectangular annular region of peripheral devices and contact pads for the connection of external leads thereto. The rows of basic units are, moreover, spaced apart by wiring roadbeds which together with a defined pattern of tunnels provide a means whereby suitable interconnection to the various devices can be made. Another similar type of universal array is disclosed in U.S. Ser. No. 562,245, entitled, "Improved Circuit Density ICs", filed in the name of R. Pryor on Dec. 16, 1983.

In implementing the interconnects, a customizing conductive layer is first applied over the array surface and thereafter coated with photoresist material and then exposed to activating radiation through a custom patterned mask. The custom masked pattern causes the activating radiation to protect those portions of the conductive material which are needed to interconnect the semiconductor devices while leaving unprotected the remaining portions of the customizing conductive layer. The unprotected portions of the customizing layer are removed by etching and the resulting structure is thereafter passivated to prevent environmental damage.

Because hand design of a customizing mask for this type of array has been found to be prohibitively time consuming and expensive, computer aided design (CAD) systems have been developed to automatically design the customizing mask. Such systems accept an input of a desired integrated circuit design and thereafter generate a specification of a mask pattern which is used to pattern the conductive layer into the desired integrated circuit structure. This is done through a computer implemented process involving automatic assignment of logic cells to rows of the universal array, automatic placement of assigned logic cells along the rows, and automatic routing of customizing conductors or wires. The resulting mask specification is then used to control a mask generating computer system which converts the specification into the physical pattern of the mask. Thereafter, that mask is used in a photoetcher to customize the specific circuit configuration.

A computer aided design system must insure that 100% of the customizing conductors are routed automatically in order for its mask specification to be directly convertible to the final mask used to pattern the customizing layer. Semiconductor area is wasted if a routing system must restrict an integrated circuit design to actually using only a relatively low percentage, typically 60% or 70% of the universal array's basic units. Some placement and routing systems must impose such restrictions in order to insure the routing system's ability to complete routing of 100% of the connecting conductors. It is therefore desirable that the automatic system be able to complete 100% of the routing and circuits which use high percentages of the basis units which are available in the array.

Two improved methods of cell placement and conductor routing on a single level of metallization are known and are disclosed, for example, in two pending applications. Respectively they comprise a patent application entitled, "Cell Placement Method in Computer-Aided-Customization of Universal Arrays and Resulting Integrated Circuit", by Richard Noto and David C. Smith, U.S. Ser. No. 608,788, filed on May 10, 1984, and a patent application entitled, "Routing Method in Computer-Aided-Customization of Universal Arrays and Resulting Integrated Circuit", by David C. Smith and Richard Noto, Ser. No. 608 772, filed on May 10 1984. The teachings of these applications are meant to be specifically incorporated herein by reference.

The routing process disclosed in the aforementioned application Ser. No. 608,772 involves an iteration of direct routing and pathfinding routing routines. In direct routing, the process checks each route in a specific-limited set of possible routes to see if one of these routes is available for the conductor being routed and follows straight line segments which extend parallel to or perpendicular to the roadbed intermediate the rows of basic units. The direct router selects the first one of those routes which is available as the route that conductor will take. If none of those routes is available, a pathfinding routing technique is resorted to.

In the cell placement method disclosed, unused basic units are assigned to rows in an inverse barrel configuration to reduce the congestion of the wiring in high congested regions of a universal array and is particularly applicable to a variable geometry array such as disclosed in a patent application entitled, "Variable Geometry Automated Universal Array", U.S. Ser. No. 474,511, now U.S. Pat. No. 4,568,961, which was filed in the name of Richard Noto, on Mar. 11, 1983.

Conductor routing on a plurality of different levels is also known. An example of this technique is disclosed in U.S. Pat. No. 4,500,963, entitled, "Automatic Layout Program For Hybrid Microcircuits (Hypar)", which issued to David C. Smith, et al. on Feb. 19, 1985. The teachings of this patent are also meant to be incorporated herein by reference.

Accordingly, it is an object of the present invention to provide an improvement in automatic layout programs for automated universal arrays.

It is a further object of the invention to provide an improvement in the routing of conductors in computer aided customization of automated universal arrays.

Still a further object of the invention is to provide an improved routing method in the computer aided customization of a two level automated universal array.

SUMMARY OF THE INVENTION

Briefly, the foregoing and other objects of the invention are provided by a routing method implemented in the stored programs of a digital computer which is programmably operated to generate the wire interconnect masks on both levels of a two level metallization automated universal array having undefined roadbeds between rows of identical semiconductor device basic units which are further interconnected to provide standard logic cells or gates required for a particular integrated circuit structure. Conductor routing is provided by a computer aided design system that first performs a route analysis which determines in which roadbed each wire should be routed in conjunction with generating a routing density profile for minimizing congestion for a particular circuit design and when the roadbed density is exceeded by removing wires, if need be. Following route analysis, detailed routing and rerouting is performed utilizing direct router, "greedy" channel router, and pathfinder sub-routines with rerouting being performed after each channel router and pathfinder sub-routine. The greedy channel router sub-routine makes a single pass left to right routing all wires which cross each successive point simultaneously and, if necessary, delete a wire or wires which are then routed by the pathfinder sub-routine.

BRIEF DESCRIPTION OF THE DRAWINGS

FIG. 7 is a flow chart generally illustrative of the automatic layout program in accordance with the subject invention for producing the customizing masks for the universal array shown in FIG. 3;

FIGS. 12A through 12C are diagrams illustrative of the criteria utilized for the dummy feedthrough placement portion of the route analysis routine shown in FIG. 8.

DETAILED DESCRIPTION OF THE INVENTION

Figure 1:
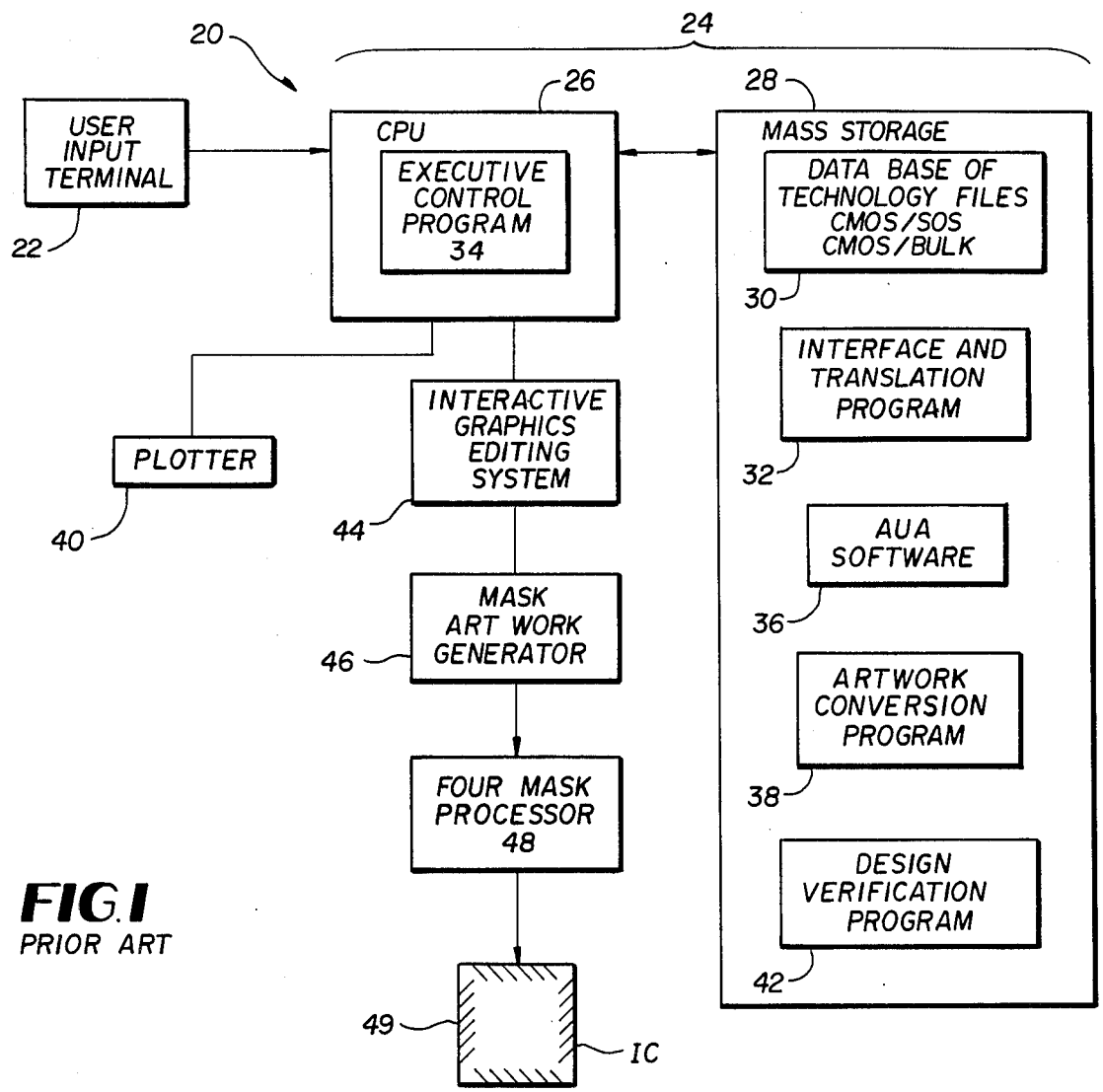
FIG. 1 is a block diagram illustrative of a known prior art computer aided design system which is applicable to the present invention.

Referring now to the drawings and more particularly to FIG. 1, shown is a computer aided design system in accordance with known prior art and which is adapted to incorporate the subject invention for customizing the masks for a double level metal automated universal array. As shown, the sytem includes a user input terminal or work station 22 through which the definition of the required integrated circuit is entered by the circuit designer. A data management and control system in the form of a digital computer 24 further includes a central processing unit (CPU) 26 and a mass storage 28 which is coupled to the CPU 26. The storage 28 further includes, among other things, data in the form of files 30 which define a data base including all the required technology for implementing a predetermined digital logic configuration fabricated in CMOS/SOS or bulk CMOS. CMOS is an acronym for complementary metal oxide silicon circuitry while SOS is an acronym for silicon on a sapphire substrate and is used to refer to semiconductor grown on an electrically insulating substrate. Bulk refers to circuitry fabricated in a single body of semiconductor material. The storage 28 also includes a number of computer programs which are transferred to the CPU 26 as needed. One of these programs is the interface and translation program 32. Under the control of a control executive program, not shown, the interface and translation program 32 combines the user's input with the data base files 30 into a placement and routing file containing the user's specified logic cells and their pin wire interconnection. A set of routines indicated as AUA software 36 and which comprises the subject invention operates on this file and then places the logic cells and routes the customizing conductors or wires contained in that file. The output from the AUA placement and routing software 36 is a definition of a customizing mask in the well known Banning Artwork Language. An artwork conversion program 38 then operates to convert this mask definition into a form which is appropriate to drive a plotter 40, a design verification program 42 and an interactive graphics editing program 44. The plotter 40 is used to provide a hard copy which the designer can then review. The design verification program 42 furthermore checks the design to be sure that the defined mask will actually provide the connections it is supposed to provide and does so without introducing any connections it should not and without violating any of the design rules for the particular universal array, such as line widths, spacing, etc. The interactive graphics editing system 44 may be used to edit the mask design to correct any design errors which may have been identified. The output of the interactive graphics editor is also coupled to an artwork generator 46 which controls the generation of the physical pattern of the mask. In the present invention, four masks must be processed as indicated by reference numeral 48 to provide four levels, each requiring deposition and etching, to thereby generate a contact level, a Metal-One level, a via level, and a Metal-Two level in the fabrication process. The resulting integrated circuit structure is shown by reference numeral 49.

Figure 2:
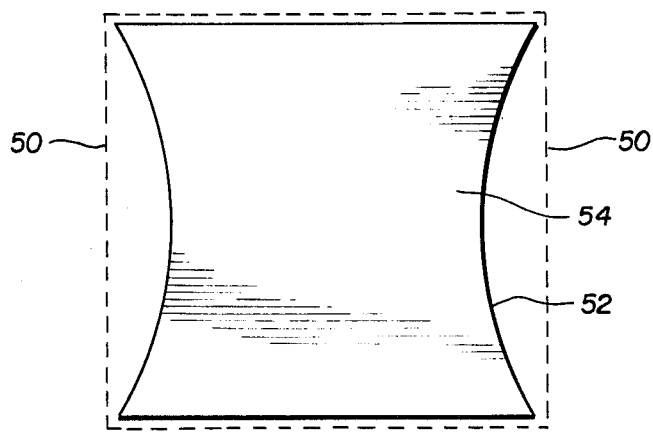
FIG. 2 is a diagram illustrative of a known prior art distribution of used basic units per row in a universal array utilizing the teachings of the present invention.

The present invention is incorporated in the AUA software 36 shown in FIG. 1 to provide a programmable routing technique on two levels of metallization of an automated universal array having an undefined roadbed conductor pattern while providing cell placement in accordance with the scheme shown in FIG. 2. The cell placement concept shown in FIG. 2 comprises the subject matter of the above referenced application Ser. No. 608,778, entitled, "Logic Cell Placement Method in Computer Aided Customization of Universal Arrays and Resulting Integrated Circuit". FIG. 2 illustrates graphically the manner in which the desired automatic cell placement process distributes used, i.e. active, basic units, and unused basic units within the row region of a universal array. The dashed rectangular outline 50 represents the boundaries of the row region of a universal array and represents the number of active basic units placed on each row if they were butted side to side. Fewer active basic units are placed in the center than on the top or bottom. This in turn means that more unused basic units are placed on the middle rows than on the top and bottom rows. This distribution of unused basic units is more concentrated toward the center of the row region than toward the corners, thus providing what is referred to as an "inverse barrel" distribution. The unused basic units are then placed on the rows according to placement needs so as to generate a good cell placement with the unused basic units providing "holes" in the center of the rows to aid in routing.

Prior to considering the fabrication method of this invention, reference will be first made to FIGS. 3 and 4 which respectively depict an AUA chip and basic unit which are particularly adapted to utilize the routing concepts to be disclosed hereinafter.

Figure 3:
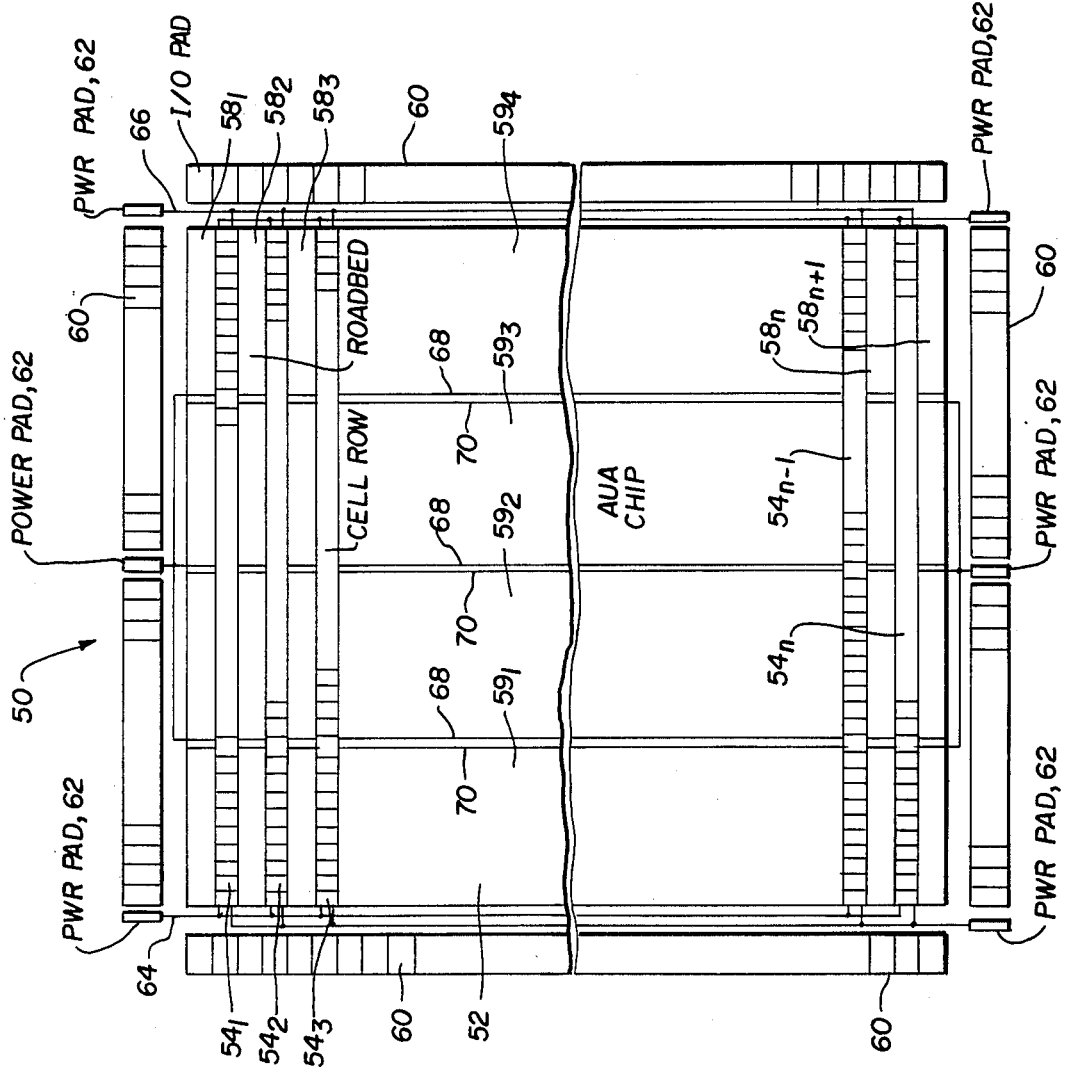
FIG. 3 is a diagram generally illustrative of a two level metal universal array particularly adapted for utilizing the subject invention.

As shown in FIG. 3, the universal array 50 is comprised of an inner row region 52 which includes a plurality of cell rows $54_1$, $54_2$, $54_3$ ... $54_{n-1}$ and $54_n$. Each cell row is further comprised of a plurality of identical basic units 56. On each side of the cell rows $54_1$ ... $54_n$ is located a wiring roadbed $58_1$, $58_2$, $58_3$ ... $58_n$, $58_{n+1}$. There is one more horizontal roadbed than there are cell rows. The roadbeds initially do not include any defined conductors nor are any tunnel patterns provided between the rows but rather a programmable interconnection is provided on two levels of metallization as will be shown. Bordering the cell rows and roadbeds are horizontal and vertical rows 60 of input and output (I/O) pads which are adapted to couple signals to and from the array. Spaced at regular intervals between the I/O pads are power pads 62 which are adapted to connect to a power bus 64 and a ground bus 66 which underlies the basic units 56 in the cell rows $54_1$ ... $54_n$. Also three sets of vertical power buses 68 and 70 divide cell rows $54_1$ ... $54_n$ and roadbeds $58_1$ ... $58_{n+1}$ into four sections $59_1$, $59_2$, $59_3$ and $59_4$. Typically, the array 50 shown in FIG. 3 includes 5000 basic units divided into n=20 rows of 250 basic units each, with each row being further divided into four sections with a separate section basic unit count being 62, 63, 63 and 62.

Figure 4:
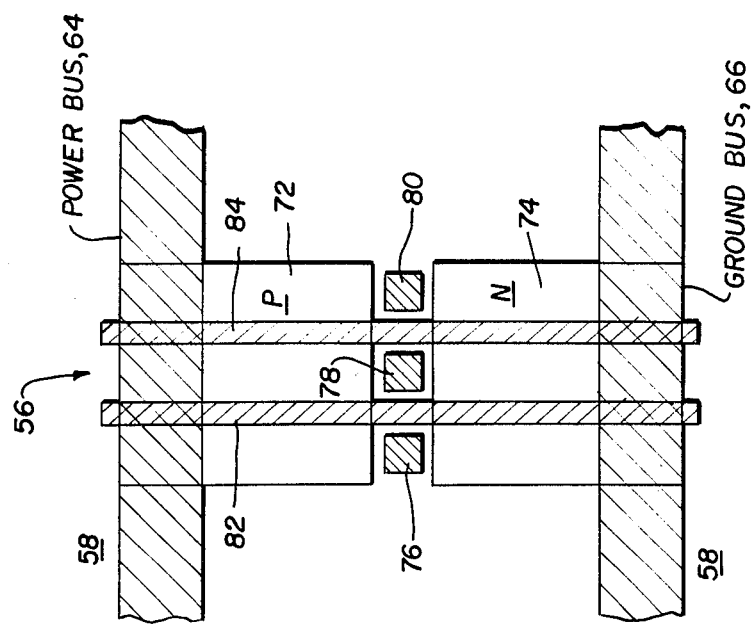
FIG. 4 is a diagram illustrative of a basic unit included in the cell rows shown in FIG. 3.

Each basic unit 56 comprises a three pin, two input configuration whose geometry is generally as shown in FIG. 4. Referring now briefly to FIG. 4, each basic unit 56 includes opposing semiconductor device regions 72 and 74 which respectively include two P channel and two N channel devices. Intermediate the two P channel and N channel device regions 72 and 74 are three centralized pins 76, 78 and 80. A first transistor pair 82 traverses the regions 72 and 74 between the pins 76 and 78 while a second transistor pair 84 traverses the regions 72 and 74 between the pins 78 and 80 parallel to the first transistor pair. Further as shown, the power bus 64 traverses the upper segment of the region 72 while the ground bus 66 traverses the lower segment of the region 74. Internal connection of the semiconductor devices and the pins 76, 78 and 80 is made on two levels of metallization.

The AUA shown in FIG. 3, moreover, comprises a double level metal array which means that beneath the outer or contact surface there exists two intermediate levels of metallization referred to as Metal-One ($M_1$) and Metal-Two ($M_2$) which are separated by a dielectric layer, not shown, and which are interconnectable by vertical vias (V). All interconnections between the devices of basic units 56 to form a logic cell is accomplished on the Metal-One ($M_1$) level, while pin interconnection such as the pins 76, 78 and 80 of the basic units and logic cells configured therefrom is accomplished by utilizing both levels $M_1$ and $M_2$ as shown in FIG. 5.

Figures 5, 6:
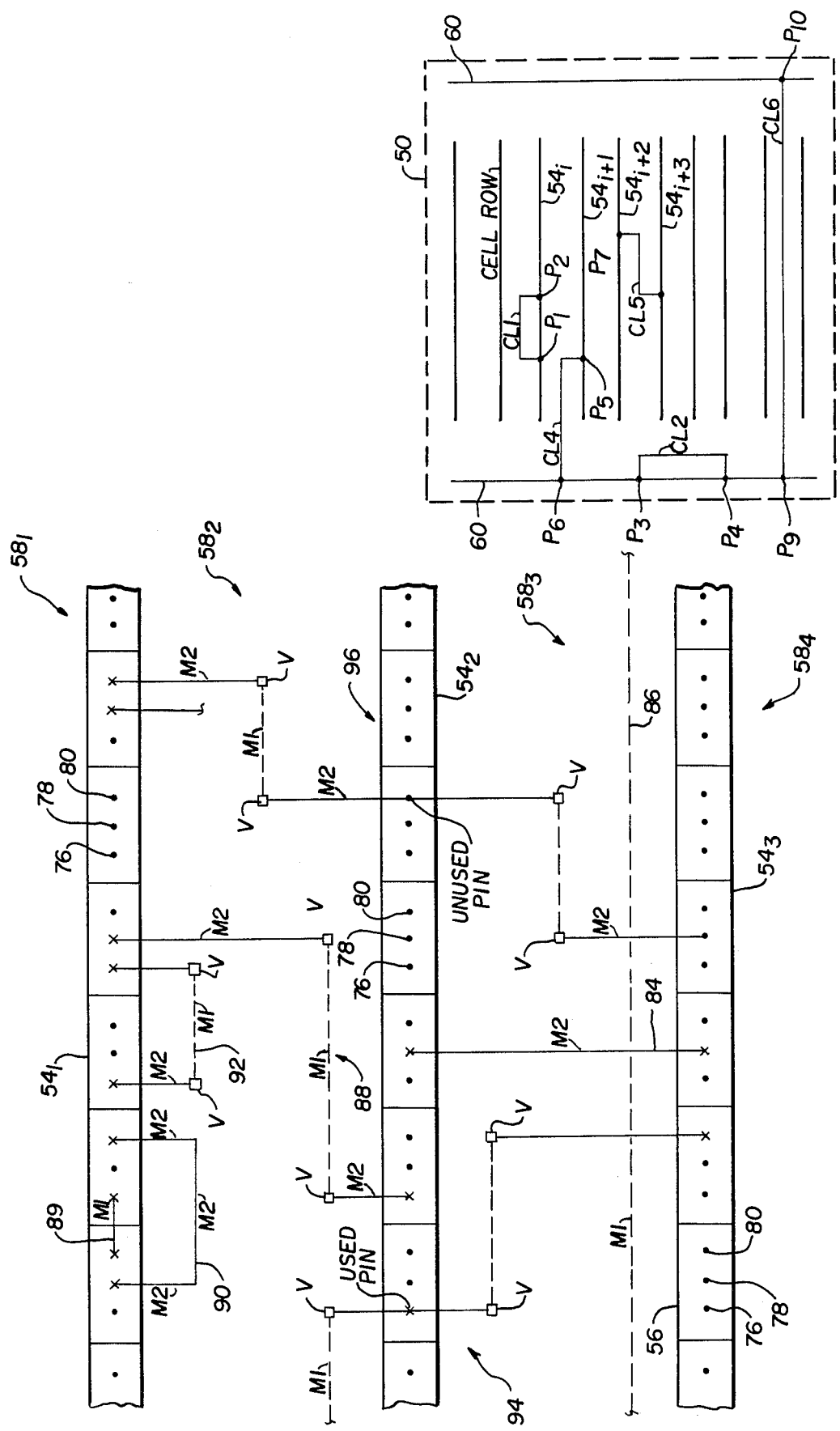
FIG. 5 is a diagram illustrative of the types of conductors routed by the subject invention on an array such as shown in FIG. 3.
FIG. 6 is a diagram illustrative of the classification of conductors routed in accordance with the subject invention.

Referring now to FIG. 5, interconnection between the cell rows $54_1$, $54_2$ and $54_3$ is achieved on both levels of metallization with perpendicular conductors or wires, i.e. those conductors entering the roadbed perpendicular to a roadbed from pins 76, 78, 80, being fabricated on the Metal-Two $M_2$ level while horizontal or parallel conductors within a roadbed, for example $58_2$ and $58_3$ are achieved by conductors fabricated on the Metal-One $M_1$ level. Reference numeral 84, for example, is illustrative of a single $M_2$ level wire (solid line) across the roadbed $58_3$ between directly opposing pins of cell rows $54_2$ and $54_3$ while reference numeral 86 denotes a Metal-One $M_1$ wire (dashed line) traveling along the length of the roadbed $58_3$ between the cell rows $54_2$ and $54_3$. Interconnection between pins in two adjacent cell rows, for example, rows $54_1$ and $54_2$ is made by a combination 88 of Metal-Two $M_2$ perpendicular wires into the roadbed $58_2$ which are then connected by a horizontal Metal-One $M_1$ wire. The interconnection between $M_1$ and $M_2$ is made by two vertical vias V as shown.

Normally, where interconnection between pins of basic units are made over the cells of a cell row, for example row $54_1$, interconnection is made on the Metal-Two $M_2$ level as shown by reference numeral 89. Where pin interconnection between basic units or logic cells are made along the same cell row, e.g. cell row $54_1$, pin interconnection can be made on the Metal-Two $M_2$ level as shown by reference numeral 90 or a combination of both Metal-One $M_1$ and Metal-Two $M_2$ conductors as shown by reference numeral 92. However, in the process of rerouting conductors, to be considered subsequently, whenever there are no crossovers, conductors can be moved from one level to the other to diminish vias. This is why the wire 90 comprises all $M_2$ conductor segments. Furthermore, a class 5 wire, to be defined subsequently, or any other wire can be made all $M_2$ where there are crossovers. Also vertical runs, which are not over cell rows, can be $M_1$ to reduce vias if there are no crossovers.

Since the basic array shown in FIG. 3 does not include tunnel patterns between rows, there are no defined cell row crossovers. Crossovers are provided as shown in FIG. 5 by a combination of Metal-One $M_1$ and Metal-Two $M_2$ conductors and associated vias shown by reference numerals 94 and 96 which respectively disclose a crossover of cell row $54_2$ at a used pin and unused pin, respectively. Use of an unused pin involves the generation of a dummy feedthrough, to be explained subsequently. It should be noted that a two or more programmable level structure is more common than a single programmable level structure.

Prior to considering the routing method of the subject invention, the conductors routed thereby are classified as shown by the diagram in FIG. 6. Referring now to FIG. 6, class 1 ($CL_1$) conductors comprise a conductor or wire between a pin pair $P_1$ and $P_2$ consisting of two pins on the same cell row e.g. row $54_i$ of the centralized set of cell rows 52. A class 2 ($CL_2$) conductor or wire comprises a conductor between a pin pair $P_3$ and $P_4$ consisting of two pins on the same side I/O pad row 60. A class 4 ($CL_4$) wire or conductor comprises a wire between a pin $P_5$ on a center row $54_{i+1}$ and a pin $P_6$ on a side I/O pad row 60. A class 5 ($CL_5$) wire or conductor comprises a wire between two pins $P_7$ and $P_8$ on two different center cell rows $54_{i+2}$ and $54_{i+3}$. A class 6 conductor comprises a wire spanning the width of the array between a pin pair $P_9$ and $P_{10}$ on opposing side I/O pad rows 60.

Referring now to FIG. 7, shown is a flow chart generally illustrative of a stored computer program consisting of a set of routines for implementing a predetermined integrated circuit on the double level metal universal array shown in FIG. 3. As shown, the implementation takes place in four separate phases comprising an input phase, a cell placement phase, a routing phase and an output phase. The input phase comprises a routine 100 wherein the design data is specified by user input followed by verification of the input perameters specified in the input data. The cell placement phase comprises an automatic placement process which results in an inverse barrel configuration substantially as taught in the above referenced application, Ser. No. 608,778, entitled, "Cell Placement Method in Computer Aided Customization of Universal Arrays and Resulting Integrated Circuit".

The cell placement algorithm provides a placement of the necessary logic gates such that the subsequent routing function will be able to accomplish 100% of the connectivity requirements, since anything less than 100% routing cannot be fabricated. Cell placement is accomplished by a cell pre-placement routine 102 followed by a Y cell placement cell routine 104 and an X cell placement routine 106, all followed by a post placement routine 108.

During pre-placement, the general layout of the cells is defined with a critical path option and inverse barrel feature being defined. In the critical path option, those elements which are identified as part of the critical logic path are forced to be located in those areas of the array which are expected to contain little other routing requirements. This means that the cells are positioned close together to one side, left or right of the cell row area where the routing and parasitics are minimal. The inverse barrel feature in the pre-placement routine forces the highly congested areas of the chip, i.e. the center cell rows to contain fewer used logic cells and thereby reduce the routing requirement in these congested areas.

The Y cell placement routine 104 provides a cell to cell row assignment such that a set of Y distance (top to bottom dimension) criteria are minimized. These Y distance criteria are: (1) minimize the number of skipped cell rows for each node, a node being defined as a set of commonly interconnected pins and their wire connectors and being at the same electrical potential and a skip row wire being defined as a wire which spans cell rows which do not include a pin in the node; (2) minimize the Y-span of each node; (3) minimize the number of cells in excess of two per node on each cell row; and (4) minimize the distance of the bottom/top cell of each node from the bottom/top of the array.

During the X cell placement routine 106, there is provided a cell-to-cell row position assignment such that the number of X distance (side-to-side dimension) criteria are minimized. The X distance criteria are: (1) minimize the X-span of each node; and (2) minimize the X-span of each element of the node to its nearest neighbor for each node. During the X cell placement process, each multi-unit cell is divided into basic units for the purposes of placement with one of the units being defined as the mother cell and the other unit being defined as the baby cells. The node connectivity data is temporarily modified to reflect this.

In the post placement routine 108, the baby cells are recombined with their mother cell to form a continuous set of basic units with pre-routing data being determined in order to provide proper information for the routing phase to follow and furthermore includes a specification of the X and Y location of the origin of each element on the chip. The post placement routine 108 also takes into account the vertical power buses 68 and 70 (FIG. 3). When any multi-basic unit cell crosses a power bus boundary, that cell will be reconfigured into a hyphenated layout, and is properly accounted for in the prerouting and output functions of the program. The concept of hyphenation is disclosed, for example, in the above referenced application entitled, "Improved Circuit Density ICs.", U.S. Ser. No 562,245.

In order to minimize the number of hyphenated cells generated, a hyphenation minimization algorithm is also included. This algorithm examines those cells which straddle the vertical power buses 68 and 70. For each of these cells, the program determines the number of basic units of that cell to the left and right of the power buses as well as the number of unused basic units to the right and left of the cell, respectively. Thus, for example, if sufficient unused basic units lie immediately to the left of the cell so that it can be shifted completely to the left of the bus without hyphenation, then it is shifted. The same applies to the right.

Following the cell placement phase, the program shown in FIG. 7 enters the routing phase, to which the subject invention is directed, and is comprised of two parts, namely, route analysis and detailed routing & rerouting. The algorithm for the route analysis routine which is identified by reference numeral 110 is further disclosed in FIG. 8, whereas the algorithm for the detailed routing & rerouting routine 112 is further disclosed in the flow chart of FIG. 9.

The output phase consists of a well known set of routines 114 which translates the placement and routing data into the required Banning artwork language for the ultimate fabrication of the customization masks for the contact level, the Metal-One (M₁) and Metal-Two (M₂) conductor patterns as well as the vias therebetween.

Figure 8:
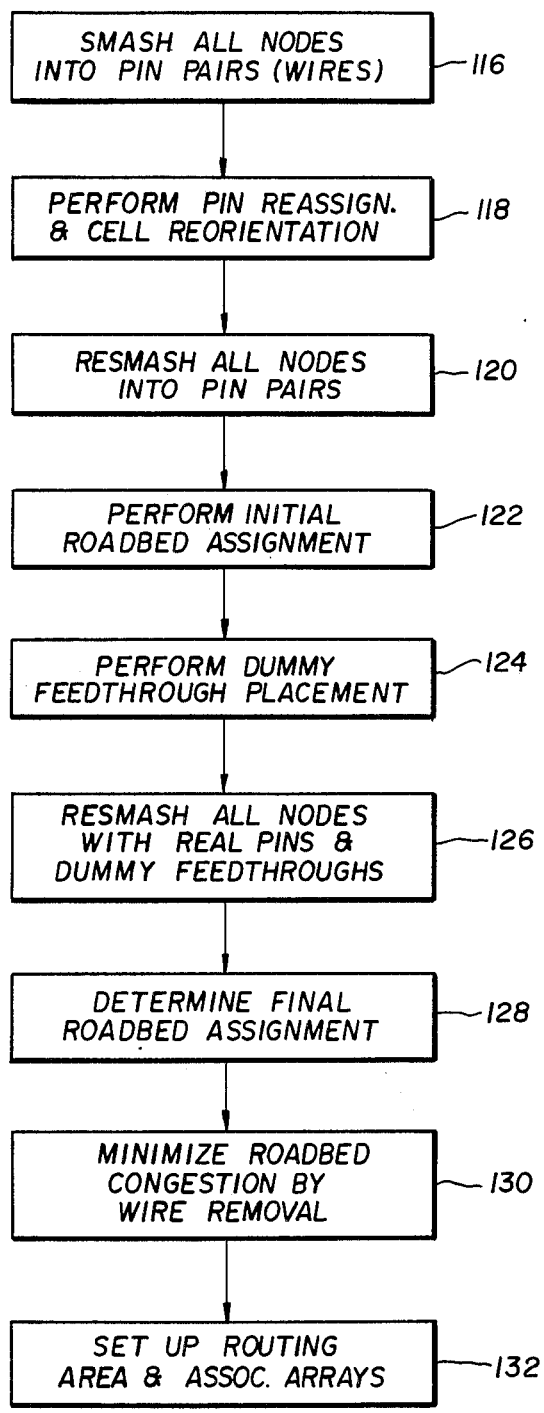
FIG. 8 illustrates in flow chart form the details of the route analysis routine shown in FIG. 7.

Referring now to FIG. 8, the route analysis routine involves a plurality of sub-routines that perform a projected or pre-routing process. The first step involves a sub-routine 116 which operates to smash all nodes into pin pairs or single wires for establishing signal routes. This is a technique which is commonly known and the entire logic network, as defined in the input data, is thereby reduced to a list in the file data of single wire pin-to-pin connections. The smash sub-routine 116 focuses on minimizing the total X-Y distance for each node. Class 5 wires (FIG. 6), at this stage are permitted to skip cell rows. A wire skipping a cell row is shown by the dashed line of FIG. 12A.

Next, a sub-routine 118 is executed which performs pin reassignment and cell reorientation. The pin reassignment can be effected by individual pins, by groups of pins or by individual and groups of pins as determined by the information specified in the pin input data. All allowable combinations of pin assignments and cell orientations are tried and evaluated and the best is chosen according to its wire length.

A second smash sub-routine 120 is next executed wherein all nodes resulting from the foregoing pin assignment and cell reorientation are reshashed into pin pairs consiting of single conductors. The criteria for minimizing the X-Y span is again utilized and skip rows for class 5 wires are again permitted. Following this, the wires are sorted by class and in the event that skip rows exist, they are sorted by node number. This means that within class 5 wires, all non-skip row wires come first followed by wires with skip rows in node number order and by the X-Y span of the wire. This sorting process provides route analysis with a short to long span sequence designed for global routing and additionally provides ascending node ordering for skip row wires for creating a node list extension.

Figure 10:
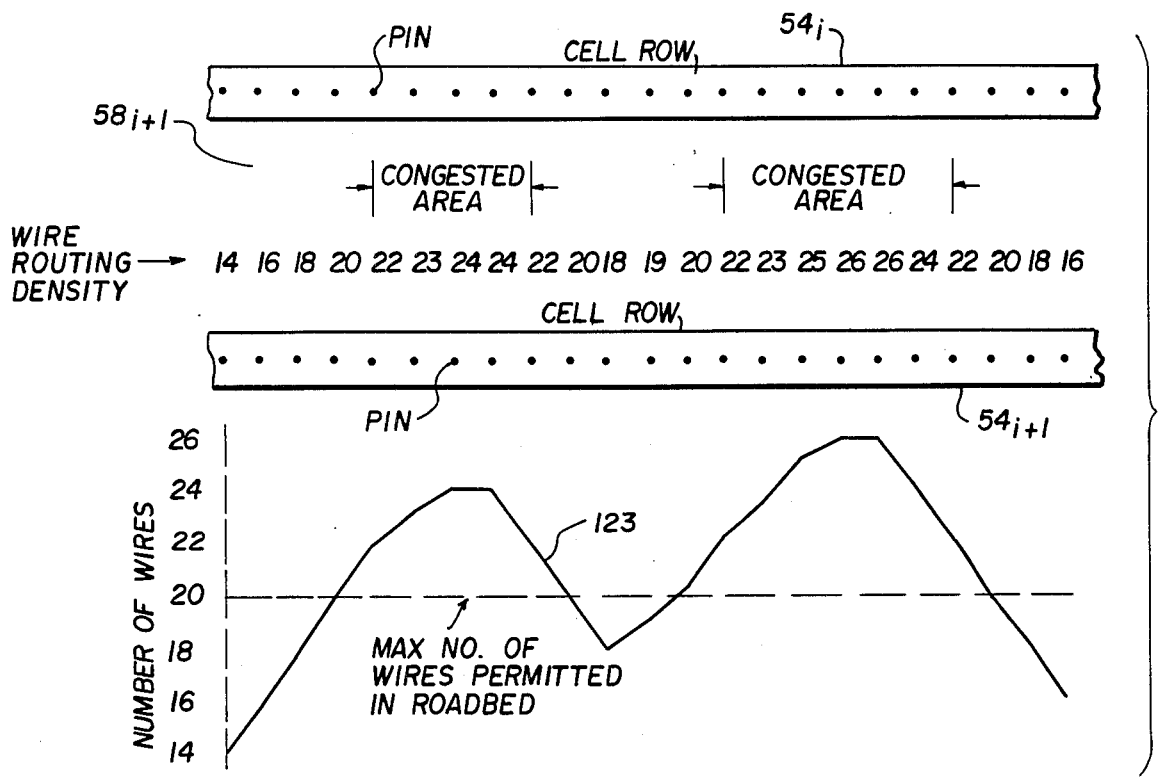
FIG. 10 is a diagram illustrative of a routing density profile for a portion of a roadbed, generated in accordance with the subject invention.

The next step in the route analysis routine involves a sub-routine 122 which performs an initial roadbed assignment by generating a routing density profile as shown in FIG. 10 for each roadbed and in accordance therewith tentatively choosing a roadbed for each wire depending upon several criteria including the roadbed density in the region traversed.

Referring now briefly to FIG. 10, a wire routing density profile is shown for the wires or conductors traversing the roadbed $58_{i+1}$ between the cell rows $54_i$ and $54_{i+1}$. The wire routing density at each pin location is shown with a variation from pin to pin being at most two wires, i.e. in the event that a wire enters the roadbed from both the upper and lower pin at that particular location. Where, for example, the maximum number of wires permitted in the roadbed is 20, i.e. a 20 channel roadbed, it can be seen that a congested area exists where the roadbed span projects 22, 23, 24, 24 and 22 wires and the span where the number of wires projected are 22, 23, 25 . . . 24, 22. A plot of this distribution, moreover, is shown by the curve 123 below cell row $54_{i+1}$.

Figure 11A:
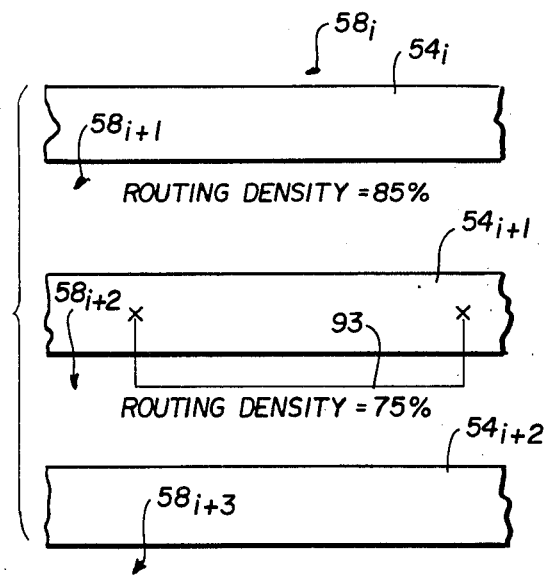
FIGS. 11A through 11D comprise four diagrams which are partially illustrative of wire assignment criteria utilized in the roadbed assignment portion of the route analysis routine shown in FIG. 8.
Figure 11B:
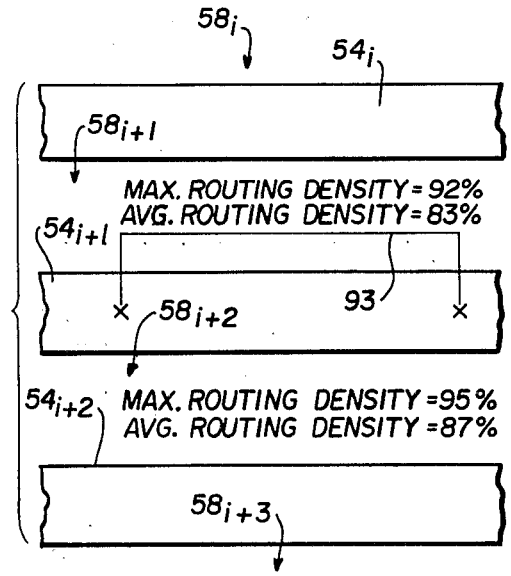
Figure 11C:
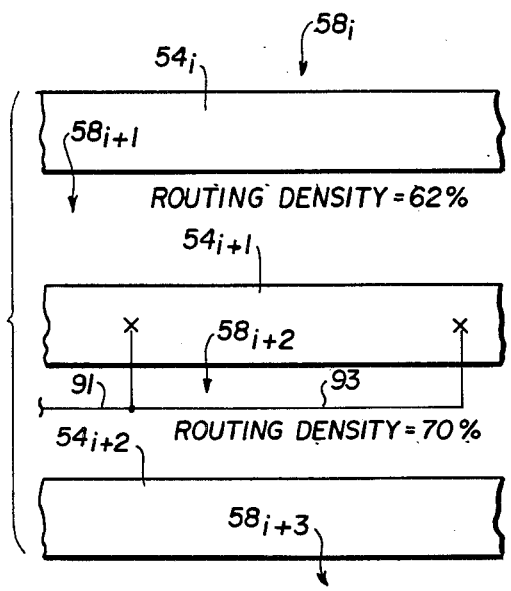
Figure 11D:
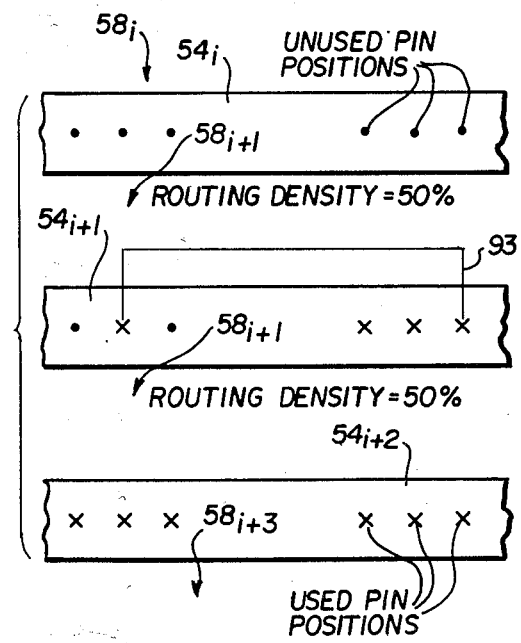

A choice of a roadbed for each wire at a particular pin location is based upon several criteria, including the highest roadbed density in the region being traversed, examples of which are shown in FIGS. 11A through 11D. Initially, class 2 wires are simply assigned to the side of the roadbed. Class 6 wires are not assigned to a roadbed at all, but are left for a pathfinder router included in the subsequent routing routine 112 (FIG. 9) to complete. Class 5 wires are assigned to the roadbed between the appropriate pins, however, there are no skipped row class 5 wires now permitted. Class 4 wires can fluctuate above and below the cell row depending upon which is closer to a sink pin or destination located at the side of the array. With respect to class 1 wires, if the routing density on either side of the cell row is greater than 75%, then the wire is placed in the roadbed having the lower density as shown in FIG. 11A. In FIG. 11A where the routing density in roadbed $58_{i+1}$ is 85%, while the density is 75% in roadbed $58_{i+2}$, a class 1 wire 93 would be assigned to roadbed $58_{i+2}$. FIG. 11B illustrates two roadbeds having an average routing density greater than 75% where the maximum routing density is the same for each, i.e. 95% and where one has an average routing density of 85% while the other has an average routing density of 87%, a class 1 wire 93 would be assigned to roadbed $58_{i+1}$ where the average routing density is 83% as opposed to roadbed $58_{i+2}$ having an average routing density of 87%. Furthermore, if the average density in both adjoining roadbeds is less than 75%, as shown in FIG. 11C, and another wire, for example, a class 4 wire 95 exists for the same node pin, then the class 1 wire 93 is assigned to the same roadbed, i.e. the lower roadbed $58_{i+2}$ as shown even though it may or may not have a lower density. Further, with the routing density in both roadbeds, for example roadbeds $58_{i+1}$ and $58_{i+2}$ having a routing density of less than 75%, i.e. 50%, as shown in FIG. 11D and the sum of adjacent unused pin positions on the row(s) adjacent the roadbed is greater than the same sum for the opposite roadbed, then that roadbed is chosen. For example, where roadbed $58_{i+1}$ has a sum of 8, as shown in FIG. 11D, and roadbed $58_{i+2}$ has a sum of 2, the roadbed $58_{i+1}$ is chosen. This process, moreover, is performed iteratively four times through the entire class 1 and class 4 wire list.

This initial roadbed assignment sub-routine 122 is utilized to generate data for a dummy feedthrough placement sub-routine 124, now to be considered. It is not intended, however, to finalize the location of the wires at this time. A dummy feedthrough is a pin location on a cell row where a signal route may cross a cell row on a Metal-Two M₂ level. A dummy feedthrough may be positioned at any unused and non-guarded pin position on a cell row and it is possible to cross the cell row without contacting the cell internals or pins because cell pin contacts are generated by cell personalization at the Metal-One (M₁) level and no contacts will exist at these positions. With respect to the dummy feedthrough placement sub-routine 124, each skip row class 5 wire generated as a result of the smash sub-routines 116 and 120, a dummy feedthrough is generated and positioned as shown in FIGS. 12A through 12C. As shown in FIG. 12A, an initial skip row wire shown by the dashed line is smashed into two class 5 non-skip row wires 95 and 97. The feedthrough placement sub-routine 124 positions a feedthrough 99 as close to the center of the span of the two pins (X) as possible as shown in FIG. 12B. After all dummy feedthroughs are added, then a set of iterative passes attempt to improve their placement in terms of routing densities. Where it is advantageous, a feedthrough will be moved as shown in FIG. 12C to minimize overall routing densities. Routing length is also considered in this evaluation. In FIG. 12C, feedthrough 99', for example, is selected with class 5 wires 95' and 97' being assigned as shown.

Following the feedthrough placement sub-routine, all nodes are resmashed into pin pairs with real pin and dummy feedthroughs as indicated by reference numeral 126 of FIG. 8. This smashing sub-routine does not permit skip row class 5 wires to be generated and no pin should have more than one connection in the same direction, i.e. traveling right or left from the pin unless the excess wires are directed to a side I/O pad row 60 (FIG. 6). The main criteria is to minimize the X span for all wires except class 4 wires which still utilize an X-Y span criteria. Again, a sorting procedure is also included in the same manner as the resmash sub-routine 120. Next a sub-routine 128 is executed to determine the final roadbed each wire should be routed in. This again includes generating a routing density profile as shown in FIG. 10 for each roadbed, as previously described. Although this roadbed assignment sub-routine makes its best effort at bringing the density of all roadbeds to less than the maximum available for each, it may not be possible due to the logic interconnection desired combined with the cell placement. Therefore, the route analysis routine 110 is enhanced by a congestion removal sub-routine 130 to ensure that each roadbed is below the critical limit.

This is important for if the roadbed is attempted to be routed with the specified assignment, it is guaranteed to fail. In addition, the wires which will fail will be in the most heavily congested area of the roadbed, and the pins of these wires will be virtually totally inaccessible. This would mean that the design is not routable. However, the congestion removal sub-routine eliminates this congestion and the problem, by choosing wires to be excluded from the routing of the roadbed so that the roadbed may be completely routed. The wires chosen are specifically chosen because of their high likelihood of being routable through other roadbeds, and the accessability of their pins. Accordingly, the congestion removal sub-routine 130 operates to analyze each roadbed assignment to determine if the roadbed density is exceeded as shown by the congested areas of FIG. 10 and if the particular roadbed has more wires than are permissible, i.e. the density is greater than 100%. If so, the largest region of congestion is determined and a further determination is made for wire candidates for removal; however, only class 1 and class 5 wires are considered.

The following criteria are utilized for removal: (1) the candidate wire must span some portion of the congested area; and (2) the pins for the candidate wire must not be in an area of congestion. In view of (1) and (2), the following additional criteria are applied until the best fit applies; (3) determine the wire which traverses the longest span of congestion; (4) determine the wire which traverses the span of highest density within the congested area; (5) determine the wire with pins with the minimum density in the vicinity of the pins; and (6) select a class 5 wire before a class 1 wire. This process is repeated until the excessive congestion is removed and the specific channel is routable. The wires which are removed will not be routed by the channel router included in the detailed routing and re-routing routine 112 which follows the route analysis routine 110 as shown in FIG. 7, but rather by the pathfinder also included in this subsequent routine.

Reiterating, choosing wires to be postponed to the pathfinder sub-routine is highly important because if the conductor routing exceeds the number of channels available in a roadbed and if the wires are allowed to fail as the conditions become congested, the wires left unrouted will be in a portion of the chip where the routing channels are already filled and the pathfinder or any other router will not be able to complete it. Accordingly, the decision to drop a wire from a roadbed is based upon the span of the wire and and the density in the heighborhood of the wire to be removed. This feature comprises the heart of the invention and can make the difference between success and failure of a particular integrated circuit design. Following the minimization of congestion, a pre-routing sub-routine is executed, as shown by reference numeral 132, which sets up the routing area and associated arrays.

Figure 9:
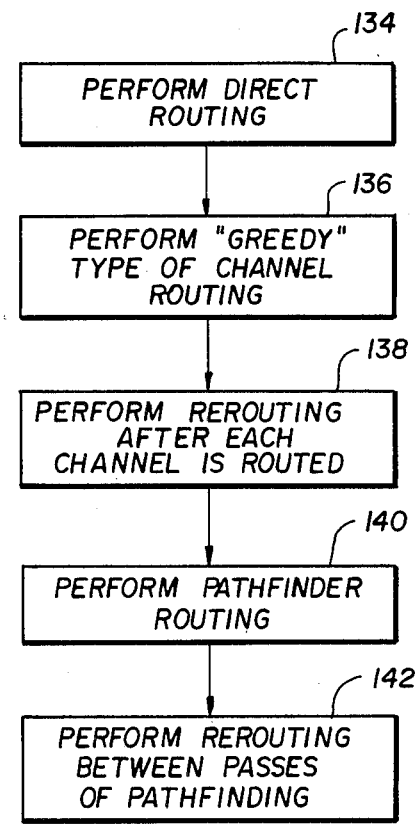
FIG. 9 illustrates in flow chart form the details of the routing and rerouting routine shown in FIG. 7.

The route analysis algorithm is followed by the detailed routing and re-routing routine 112 the details of which are shown in FIG. 9 and which comprises the second routine 112 of the routing phase shown in FIG. 7.

Considering now FIG. 9, the first routing step comprises a direct routing sub-routine 134 which comprises a relatively small well known routing algorithm which is used to interconnect very short class 1 wires between pins of the same cell row. The best example of this are two adjacent pins which are to be routed together and which is shown, for example, by the wire 88 of FIG. 5.

The next sub-routine executed comprises a channel routing sub-routine 136 which was referred to above and is operable to route in excess of 99% of all class 1 and class 5 wires. It also routes class 4 wires from the internal cell row area to the side of the array. The channel router comprises a "greedy" channel router type of algorithm and operates to complete conductor routing for each roadbed individually in a single pass, traveling from the left edge of the roadbed to the right edge thereof and routing all the wires which cross a particular point simultaneously. By routing all wires simultaneously, the routing procedure can base decisions on the total condition at that point, instead of on the requirements of a single wire. During execution of the channel router sub-routine 136, routing proceeds from the left to the right, one step at a time and for each used pin position that is crossed, a wire is brought into the roadbed area, assigned a channel, and carried to the right until it terminates at the appropriate sink or destination pin. When the right edge is reached, the only remaining wires are class 4 wires proceeding on to the right side of the array which connect to selected I/O pads of the side row 60.

Figure 13B:
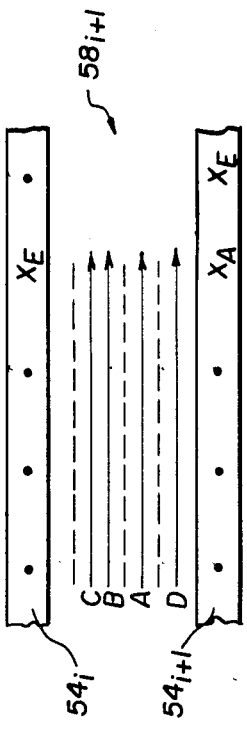
FIGS. 13A through 13F are diagrams generally illustrative of the channel routing algorithm of the detailed routing and rerouting routine shown in FIG. 9.
Figure 13D:
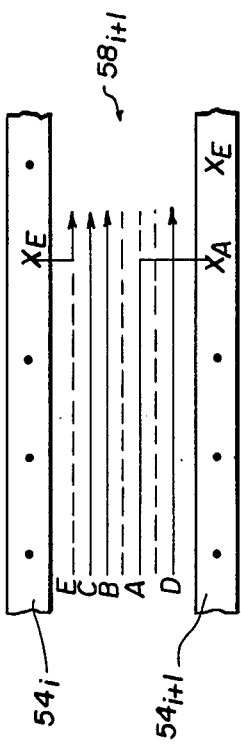
Figure 13F:
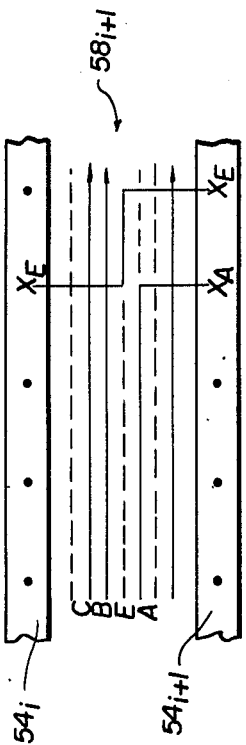
Figure 13A:
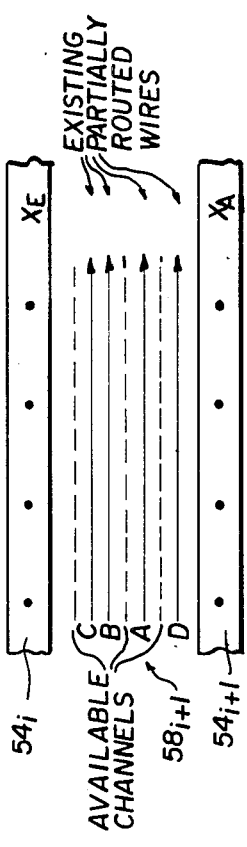
Figure 13C:
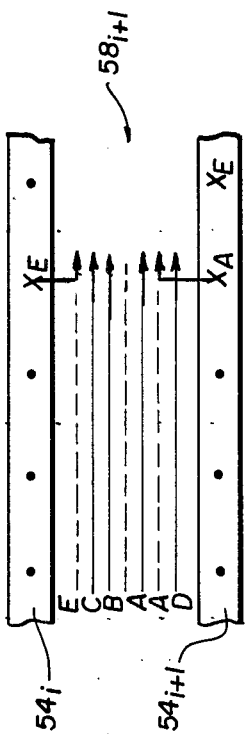
Figure 13E:
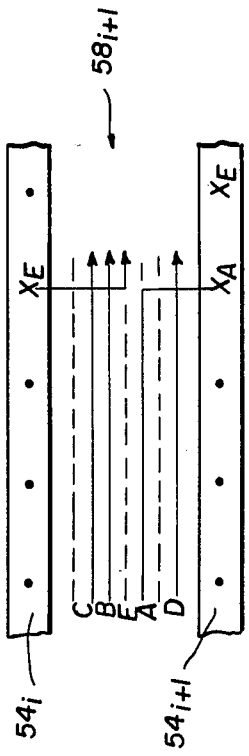

The channel router algorithm is generally shown in the FIGS. 13A through 13F. FIG. 13A is illustrative of an initial condition for a roadbed $58_{i+1}$ illustrating, for example, seven available conductor channels with existing partially routed wires A, B, C and D already in place. With reference to FIG. 13B, the router at each step extends each existing wire one pin position to the right which correspond to pin positions $X_E$ and $X_A$ in cell rows $54_i$ and $54_{i+1}$, respectively. The subscript is indicative of a common node and wire connection. Next, if a pin connection is to be made at the next indexed position such as shown in FIG. 13C, at pin $X_E$ in the cell row $54_i$ and at the pin $X_A$ in the cell row $54_{i+1}$, a wire is brought from the respective pins into the first available channel in the roadbed which is shown by the dotted lines E and A. Next the sub-routine checks all wires currently in the roadbed for wires of the same node which exist for the wire A already in the roadbed as shown in FIG. 13C, and the wire from the pin $X_A$ is extended into the roadbed to the wire A. Following this, wires currently in the roadbed and which must travel vertically to become closer to a corresponding sink pin are so routed such as the connection between pin $X_E$ in the cell row $54_i$ and the pin $X_E$ in the cell row $54_{i+1}$. Accordingly, the vertical wire from the pin $X_E$ in cell row $54_i$ is moved vertically, as shown in FIG. 13E. At the next step the connection is made between the two pins $X_E$ in the cell rows $54_i$ and $54_{i+1}$.

A very important feature of the "greedy" channel router algorithm of the subject invention comprises the further step of selecting and removing a wire upon exceeding the roadbed density which exists when, for example, the channel router brings a new wire into the roadbed and no free channel exists in which to put it. The solution is to terminate a wire already in the roadbed and subsequently routing it via the pathfinder sub-routine which follows the channel router sub-routine. This operation is shown in FIGS. 14A and 14B.

Figure 14A:
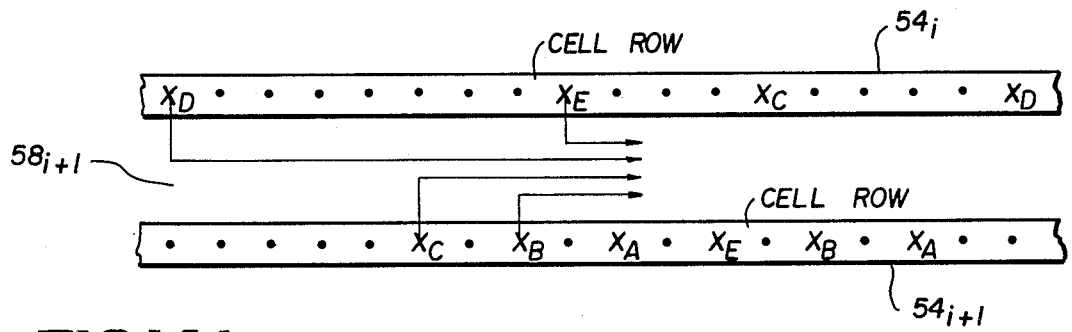
FIGS. 14A and 14B are diagrams further illustrative of the channel routing algorithm shown in FIGS. 13A through 13E.
Figure 14B:
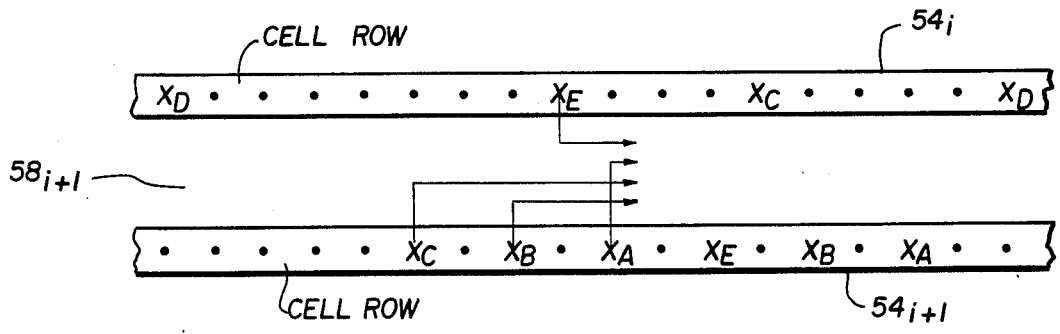

As shown in FIG. 14A, four wires have been previously routed into the roadbed $58_{i+1}$ from the pinx $X_D$ and $X_E$ from the cell row $54_i$ and from pins $X_C$ and $X_B$ in cell row $54_{i+1}$. At the point of pin $X_A$ in the cell row $54_{i+1}$, the channel router routine deletes the D wire in favor of bringing a wire vertically into the roadbed from pin $X_A$. This selection is based upon a set of criteria similar to that utilized in conjunction with the congestion removal process employed in the roadbed assignment sub-routine 128. The criteria for removing a wire from the roadbed are: (1) the wire must be currently being routed in a particular roadbed; (2) eliminate class 2, class 4 and class 6 wires from consideration, leaving class 1 and class 5 wires for termination; and (3) the wire selected must have pins which are not in a congested area, i.e. maximum density. Thereafter the following additional criteria are applied until the best wire is found: (4) the wire must be within the tolerance of all those with the longest span of the congestion; (5) the wire has pins with least dense area or at least less than 80% density; and (6) class 5 wires are selected before class 1 wires.

Under such conditions, a wire meeting the foregoing criteria most effectively promotes routability along the entire roadbed and maintains a high routability for the pathfinder, thus insuring a successful routing of all conductors in the intended circuit design. Following the completion of a pass through the channel routing sub-routine 136, a re-routing sub-routine 138 is performed.

Since one or more wires may have been removed during the channel routing process, a pathfinder routing sub-routine 140 is executed to connect any remaining wires and to finish the connection of class 4 wires. The pathfinder sub-routine comprises a maze searching routine such as the well known Lee Maze Router. The pathfinder sub-routine is furthermore executed in several steps. In the early steps, the search area for routing conductors is limited to an area near the pins. This is expanded at each step until the entire surface of the array 50, FIG. 3, is used in the final two steps. In all but the final step, the pathfinder is limited to uni-directional routing. This means that only routes traveling in the preferred direction for a level are allowed. In the final step, however, bi-directional routing is allowed, but paths using non-preferred directions are penalized. Also after the pathfinding sub-routine 140, a re-routing sub-routine 142 is executed to clean up the surface of the array.

Thus what has been shown and described is an improved method of routing conductors in an automated universal array and particularly a double level metal array having undefined roadbeds and wherein the route analysis and detail routing algorithms permit wire or conductor removal based upon a set of criteria which is a function of the roadbed routing density, with the wiring of the removed wires thereafter being performed by a pathfinder routing algorithm.

While the foregoing has been described with a certain degree of particularity, it should be noted that the same has been made by way of illustration and not limitation. Accordingly, all modifications, alterations and changes coming within the spirit and scope of the invention as defined by the appended claims are herein meant to be included.

We claim:

1. A method carried out by a computer for converting a multiple level metal universal array into a custom integrated circuit in which pre-placed basic units are arranged in parallel cell rows in a semiconductor device basic unit row region, with said cell rows being spaced apart by undefined wiring roadbeds adapted to contain conductors which run parallel to or perpendicular to the roadbeds on at least two intermediate levels of metallization separated by a dielectric layer and interconnected by selectively located vias, comprising the steps of:

(A) executing an input routine wherein input data for a predetermined integrated circuit design are entered into said computer;

(B) executing a cell placement routine which places said basic units in a predetermined configuration in said cell rows of said basic unit row region so as to maximize the effectiveness of the subsequent conductor routing;

(C) executing a conductor routing routine for enhancing the success of conductor routing further comprising the steps of performing an initial route analysis process for the desired circuit design to determine in which roadbed each wire should be routed and eliminating certain projected wires for subsequent pathfinder routing under a predetermined set of criteria when the wiring density exceeds the available tracks in any given roadbed due to the fact that if said wires are not removed, the probability for 100% completion of conductor routing is minimum and thereafter performing a conductor routing process including a direct routing process which operates to route very short wires of a predetermined class of wires, a channel routing process which operates to route most of the remaining wires while additionally eliminating certain wires from a roadbed for subsequent pathfinder routing under another predetermined set of criteria, also when the wiring density exceeds the available tracks in any given roadbed, and a pathfinder routing process which operates to route wires previously eliminated by said previous route analysis and channel routing process; and (D) executing an output routine for converting cell placement and conductor routing data provided by steps (B) and (C) into respective customization masks for the levels of metallization and their interconnection vias as well as the contact level.

2. The method as defined by claim 1 wherein said step of performing route analysis in step (C) further includes the steps of:

(a) smashing all nodes into pin pairs or single wires;

(b) performing an initial pin reassignment and cell reorientation step whereby all allowable combinations of assignment and cell orientation are tried and evaluated;
(c) resmashing all nodes into pin pairs;
(d) performing an initial roadbed assignment of conductors;
(e) performing a dummy feedthrough placement for a predetermined class of conductors;
(f) resmashing all nodes with real pins and dummy feedthroughs;
(g) determining a final roadbed assignment of conductors;
(h) minimizing roadbed congestion by wire removal for said pathfinder routing process; and
(i) setting up a routing area and associated array.

3. The method as defined by claim 2 wherein said step (a) of smashing all nodes into pin pairs comprises attempting to minimize the vertical and horizontal distance for each node while permitting class 5 wires to skip cell rows of said basic unit row region,
a class 5 wire being defined as a conductor between pins on two different cell rows of said basic unit row region.

4. The method as defined by claim 2 wherein said step (d) of performing an initial roadbed assignment additionally includes the step of generating a routing density profile for each roadbed and in accordance therewith tentatively choosing a roadbed for each wire depending upon another predetermined set of criteria for the roadbed region traversed.

5. The method as defined by claim 4 wherein said another predetermined set of criteria is a function of the roadbed density in the region traversed and the specific class of wires being assigned, the classes of wires further including: class 1 wires which are defined as wires between a pair of pins on the same cell row of said basic unit row region; class 2 wires which are defined as wires between a pair of pins on the same side row of input/output pads located on either side of said basic unit row region; class 4 wires which are defined as wires between a pin on a cell row of said basic unit row region and a pin on a side row of input/output pads; class 5 wires which are defined as wires between pins on two different cell rows of said basic unit row region; and class 6 wires which are defined as wires spanning the width of said basic unit row region and connected between respective pins on opposite side rows of input/output pads.

6. The method as defined by claim 5 wherein said step (d) of performing an initial roadbed assignment includes the steps of:
(i) assigning class 1 wires to a roadbed on either side of the specific cell row depending upon the routing density thereat,
(ii) assigning class 2 wires to the side of a roadbed,
(iii) assigning class 4 wires to a roadbed on either side of a specific cell row of said basic unit row region depending upon which is closer to a sink or destination pin at said side row of input/output pads,
(iv) preventing class 5 wires from skipping cell rows of said basic unit row region, and
(v) excluding the assignment of class 6 wires to any roadbed and thereafter routing said wires by said pathfinder routing process.

7. The method as defined by claim 6 wherein said step (i) for assigning class 1 wires further comprises the steps of:

(vi) assigning a class 1 wire in the roadbed having the lower density where the routing density on either side of a cell row is greater than 75%;
(vii) assigning a class 1 wire to the same roadbed as an existing wire where the average density in the roadbeds on both sides of a cell row is less than 75% and a wire already exists in one of the roadbeds for the same node pin; and
(viii) where a routing density of less than 75% exists in the roadbeds in both sides of a cell row and the sum of adjacent unused pin positions is unequal, then assigning a class 1 wire in the roadbed adjacent the greater number of unused pin positions.

8. The method as defined by claim 2 wherein said step (e) of performing dummy feedthrough placement comprises the steps of:
(i) determining unused and unguarded pin positions on the cell row for routing skipped cell row class 5 wires permitted during steps (a) and (c);
(ii) smashing said class 5 skip row wires into a pair of class 5 non-skipped cell row wires terminating at the selected unused pin; and
(iii) thereafter making a set of iterative passes to improve the feedthrough position and said pair of class 5 non-skipped cell row wires to improve their placement in terms of routing density,
a class 5 wire being defined as a wire between two pins respectively located on two different cell rows of said basic unit row region.

9. The method as defined by claim 2 wherein said step (g) of determining final roadbed assignment also includes the step of generating a routing density profile for each roadbed for placing conductors in adjoining roadbeds of a cell row as a function of roadbed density and the class of wires being assigned to said roadbeds.

10. The method as defined by claim 2 wherein said step (h) of minimizing roadbed congestion by wire removal further comprises the steps of:
(i) analyzing each roadbed assignment to determine if the roadbed density is exceeded, and
(ii) eliminating class 1 and class 5 wires in accordance with the following criteria if said roadbed density is exceeded: (1) the candidate wire must span some portion of the congested area; and (2) the pins for the candidate wire must not be in the area of congestion; class 1 wires being defined as conductors between two pins in the same cell row of said basic unit row region and class 5 wires being defined as conductors between pins on two different cell rows of said basic unit row region.

11. The method of claim 10 and additionally including the following steps until the best fit obtains:
(iii) determining the wire which traverses the span of highest density within the congested area;
(iv) determining the wire with pins with the minimum density in the vicinity of the pins; and
(v) selecting a class 5 wire for removal before a class 1 wire.

12. The method as defined by claim 1 wherein said step of performing a channel routing process comprises a greedy channel routing process including the step of removing a wire from a roadbed in accordance with the following criteria:
(1) the wire must be currently being routed in a particular roadbed;
(2) eliminate class 2, class 4, and class 6 wires from consideration while considering class 1 and class 5 wires for elimination; and (3) select class 1 and 5 wires having pins which are not in a congested area;

class 1 wires being defined as conductors between respective pin pairs on the same cell row of said basic unit region, class 2 wires being defined as conductors between respective pin pairs on the same side row of input/output pads adjacent said basic unit region, class 4 wires being defined as conductors between a pin on a cell row of said basic unit region and a side row of input/output pads, class 5 wires being defined as conductors between respective pin pairs on two different cell rows of said basic unit row region, and class 6 wires being defined as conductors spanning the width of the basic unit row region to respective pin pairs on opposing side rows of input/output pads.

13. The method as defined by claim 12 wherein said step of removing a wire from a roadbed applies the following additional criteria until the best wire is found for elimination;

(4) the wire must be within the tolerance of all those with the longest span of the congestion;

(5) the wire has pins with the least dense area or at least less than 80 % density; and (6) class 5 wires are selected for elimination over class 1 wires.

* * * * *